(12) United States Patent
Ganrot

(10) Patent No.: US 6,603,662 B1
(45) Date of Patent: Aug. 5, 2003

(54) COMPUTER COOLING SYSTEM

(75) Inventor: Lars T. Ganrot, Mountain View, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/057,096

(22) Filed: Jan. 25, 2002

(51) Int. Cl.[7] ................................................. H05K 7/20
(52) U.S. Cl. ........................ 361/698; 165/908; 361/719
(58) Field of Search ............................. 174/15.1, 16.1, 174/16.3; 165/80.3, 80.4, 104.33, 185, 908; 62/259.2; 257/714, 719; 361/687, 704, 690–698, 699, 700, 709–712, 717–719

(56) References Cited

U.S. PATENT DOCUMENTS

| | | | | |
|---|---|---|---|---|
| 4,149,218 A | * | 4/1979 | Carrubba et al. ............ 361/691 |
| 4,674,004 A | * | 6/1987 | Smith et al. ................. 361/694 |
| 5,067,047 A | * | 11/1991 | Azar ........................... 361/691 |
| 5,084,671 A | * | 1/1992 | Miyata et al. ............... 324/760 |
| 5,183,104 A | * | 2/1993 | Novotny ................. 165/104.33 |
| 5,428,503 A | * | 6/1995 | Matsushima et al. ........ 361/695 |
| 6,313,992 B1 | * | 11/2001 | Hildebrandt ................. 361/700 |
| 6,377,453 B1 | * | 4/2002 | Belady ......................... 361/687 |
| 6,388,882 B1 | * | 5/2002 | Hoover et al. ............... 361/704 |

\* cited by examiner

Primary Examiner—Gerald Tolin
(74) Attorney, Agent, or Firm—Rosenthal & Osha L.L.P.

(57) ABSTRACT

A computer cooling system including a cooling fluid source, and a cooling duct array adapted to distribute cooling fluid from the cooling fluid source over a plurality of high dissipation components on a circuit board.

14 Claims, 5 Drawing Sheets

COMPUTER COOLING SYSTEM

BACKGROUND OF INVENTION

The electronics industry is striving towards increased performance of their products. This is commonly achieved through higher and higher levels of integration. This has resulted in the use of components (e.g., microprocessors) that dissipate more heat per unit volume. As the number of components increases within a given computer, so does the heat dissipated. This development has not been tracked by an equal reduction in power dissipation for the individual components. Thus on a densely populated circuit board, the power dissipation per area is increasing.

Typically components are designed to work at relatively low temperatures, thus the heat that they generate must be efficiently removed. Traditionally, removal of heat was achieved through the use of a fan, or equivalent device for passing cool air over the components. As the number of components per computer has increased, and the amount heat dissipated per component has increased, traditional fan cooling is no longer sufficient to effectively remove heat. Computer manufacturers have subsequently used additional heat removal devices such as heat pipes, fins, pin fins, etc. to aid in the removal of heat. The paradox of these heat dissipators is that once the component population increases so does the air flow resistance through them. This requires oversizing the dissipators since the cooling flow is not laminar across the circuit board and the more distant components are in effect being cooled by air that has already been heated by components closer to the source of the air stream.

FIG. 1 illustrates a prior art computer cooling system. A circuit board (10) typically contains a number of high dissipation components (12), and low dissipation components (14). The high dissipation components (12) typically include microprocessors, while low dissipation components (14) typically include capacitors, etc. To remove heat dissipated by the high dissipation components (12), the prior art computer cooling system includes heat pipes (16) mounted on top of the high dissipation components (12). The heat pipes (16) serve to remove heat from the high dissipation components (12) via conduction. The heat conducted to the heat pipes (16) is subsequently removed by a fan cooling air flow (18).

SUMMARY OF INVENTION

In general, in one aspect, the present invention relates to a computer cooling system, comprising a cooling fluid source, and a cooling duct array adapted to distribute cooling fluid from the cooling fluid source over a plurality of high dissipation components on a circuit board.

In general, in one aspect, the present invention relates to a computer cooling system, comprising a cooling fluid source; and a cooling duct array adapted to distribute cooling fluid from the cooling fluid source over a plurality of heat dissipating components on a circuit board, and a backplane having a bus with at least one port, wherein the cooling duct array is connected to the at least one port with a connector.

In general, in one aspect, the present invention relates to a method for cooling a computer system comprising transporting cooling fluid from a cooling fluid source to a circuit board, and distributing the cooling fluid over a plurality of high dissipation components on the circuit board using a cooling duct array.

In general, in one aspect, the present invention relates to a method for cooling a computer system comprising transporting cooling fluid from a cooling fluid source to a circuit board, and distributing the cooling fluid over a plurality of heat dissipating components on the circuit board using a cooling duct array, and compressing the cooling fluid at the cooling fluid source prior to transporting.

Other aspects and advantages of the invention will be apparent from the following description and the appended claims.

DETAILED DESCRIPTION

Figure 1:
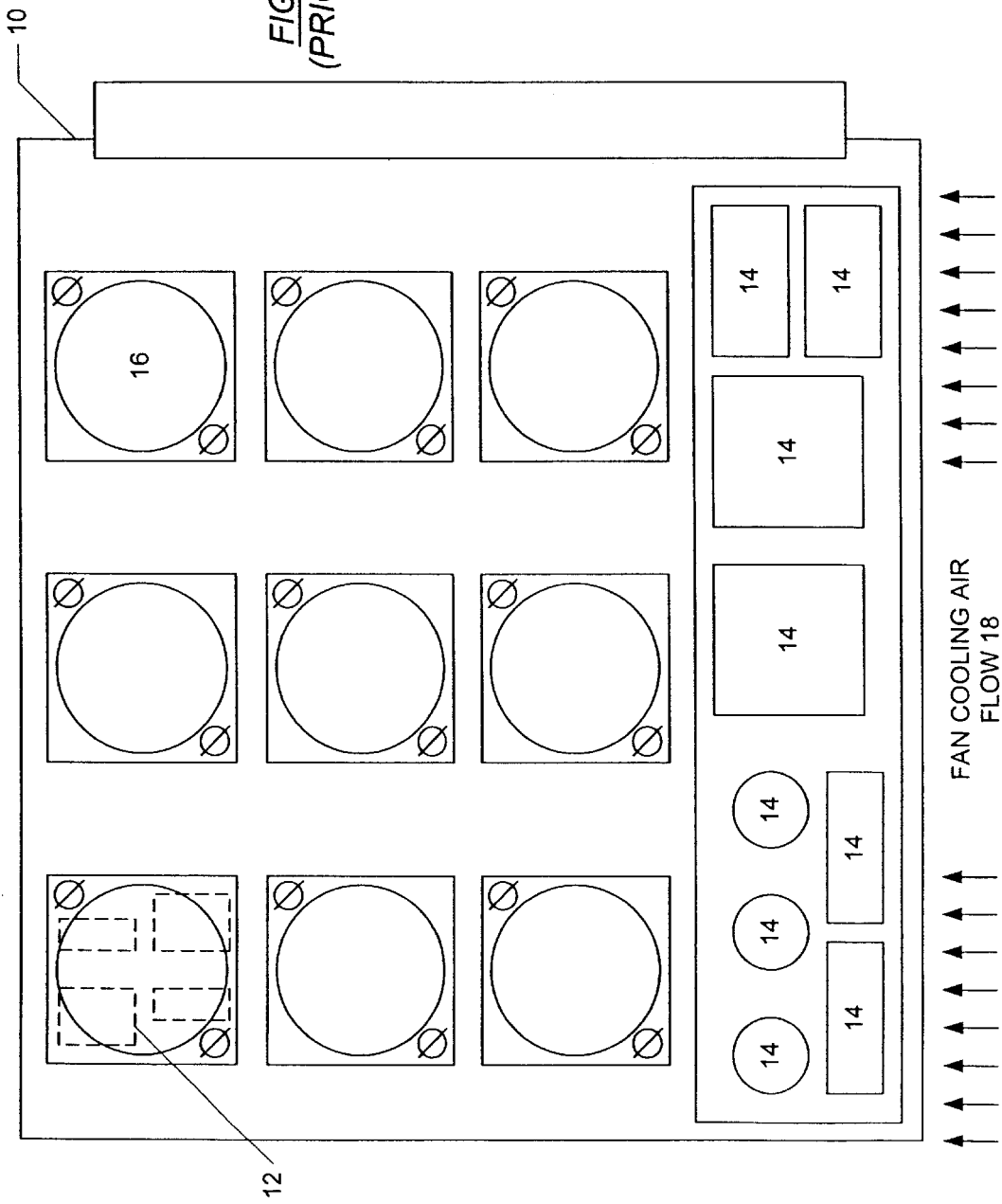
FIG. 1 illustrates a typical prior art computer cooling system.

Embodiments of the invention will be described with reference to the accompanying drawings. Like items in the drawings are shown with the same reference numbers.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

The invention relates to a computer cooling system. Further, the invention relates to cooling high dissipation components in the computer system using a cooling fluid. Further, the invention relates to distributing the cooling fluid through a cooling duct array.

Figure 2:
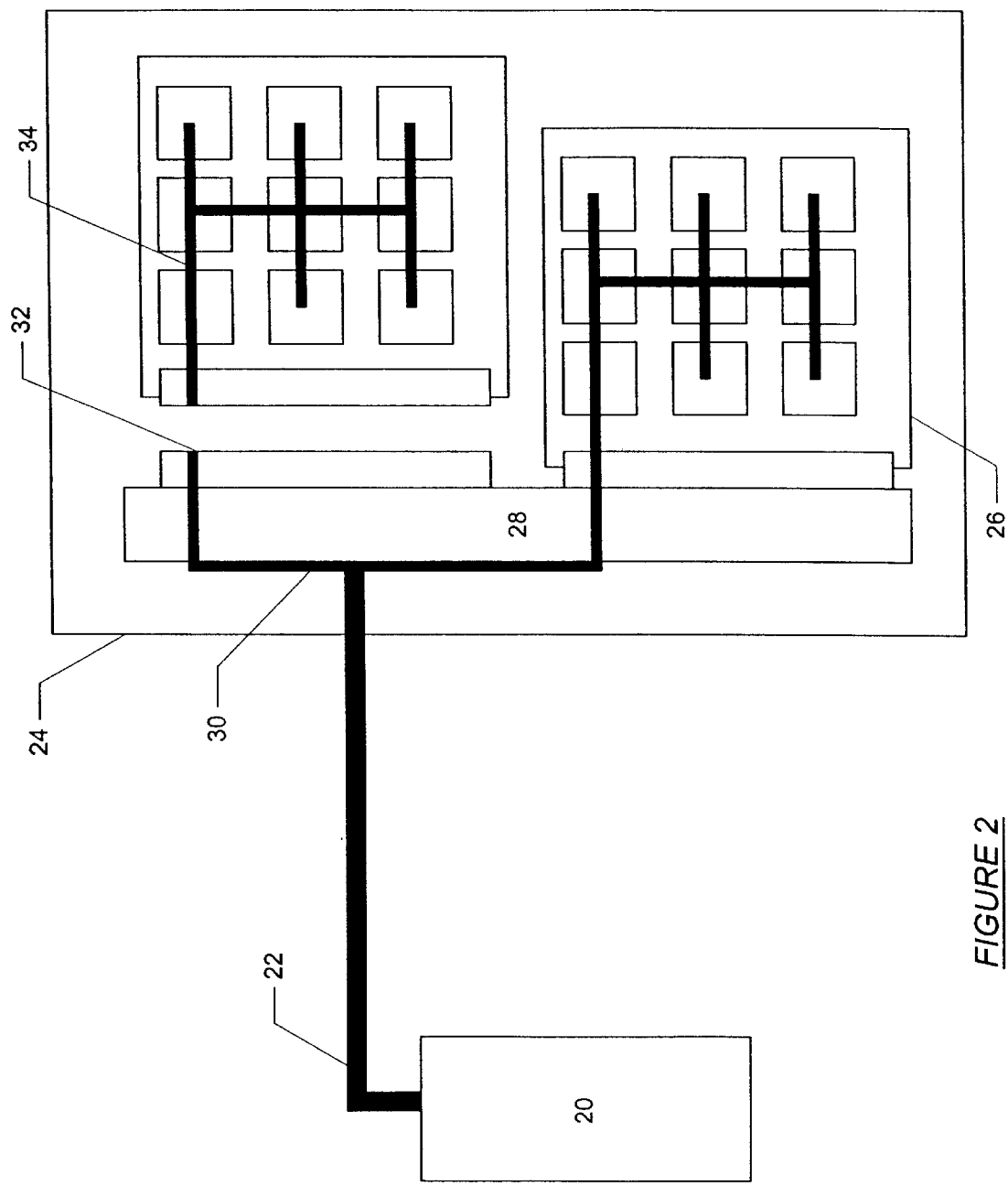
FIG. 2 illustrates a computer cooling system in accordance with one embodiment of the invention.

FIG. 2 illustrates a computer cooling system in accordance with one embodiment of the invention. The computer cooling system includes a cooling fluid source (20), a piping system (22), and a cabinet (24) housing a number of circuit boards (26). In the embodiment of the computer cooling system illustrated in FIG. 2, the cooling fluid source (20) is a dehumidifier/compressor. However, those skilled in the art will appreciate that the cooling fluid source (20) may also be a compressed cooling fluid tank. Further, while two embodiments of the cooling fluid source (20) have been provided, those skilled will appreciate that the cooling fluid source (20) is not limited to either embodiment.

In one embodiment of the invention the cooling fluid is compressed air. In another embodiment of the invention the cooling fluid is a compressed gas. In another embodiment of the invention the cooling fluid is dehumidified prior to being transferred via the piping system (22), to the cabinet (24).

The cooling fluid source (20) is connected to the cabinet (24) by the piping system (22). In one embodiment, the piping system (22) may include a piping system suitable for transferring compressed cooling fluid. In another embodiment, the piping system may be a piping system suitable for transferring cooling fluid that is moved by a fan which in such embodiments is the cooling fluid source. The piping system (22) transfers the cooling fluid from the cooling fluid source (20) to the cabinet (24). In one embodiment of the invention the piping system (22) is connected to a backplane (28). The backplane (28) provides electrical and cooling duct array interfaces for circuit boards (26). The cooling duct array interface may include a bus (30) with ports (32) to connect a number of circuit boards (26). The ports (32) on the bus (30) connect to a cooling duct array (34), attached to the circuit board (26).

In one embodiment of the invention the ports (32) include self-sealing valves (not shown) such that when the cooling duct array (34) is attached to one of the ports (32) the self-sealing value is open. When the cooling duct array (34) is disconnected from the port (32) the self-sealing valve will close. This functionality allows the bus (30) to operate, even when all the ports (32) are not in use. Further, this functionality will allow circuit boards (26) to be "hot swapped." Hot swapping is defined as the ability to remove or insert elements, in this particular case circuit boards, into the computer system while it operating.

In one embodiment of the invention, the cabinet (24) includes vents (not shown) such that the cooling fluid distributed via the cooling duct array (34) to the circuit boards (26) may exit the cabinet (24) therethrough. In some embodiments the vents allow the cabinet to achieve an internal pressure greater than the pressure of the air surrounding the cabinet (24). The overpressure provides a means to prevent dust and other foreign airborne component from entering the cabinet and interacting with the components within the computer.

Figure 3:
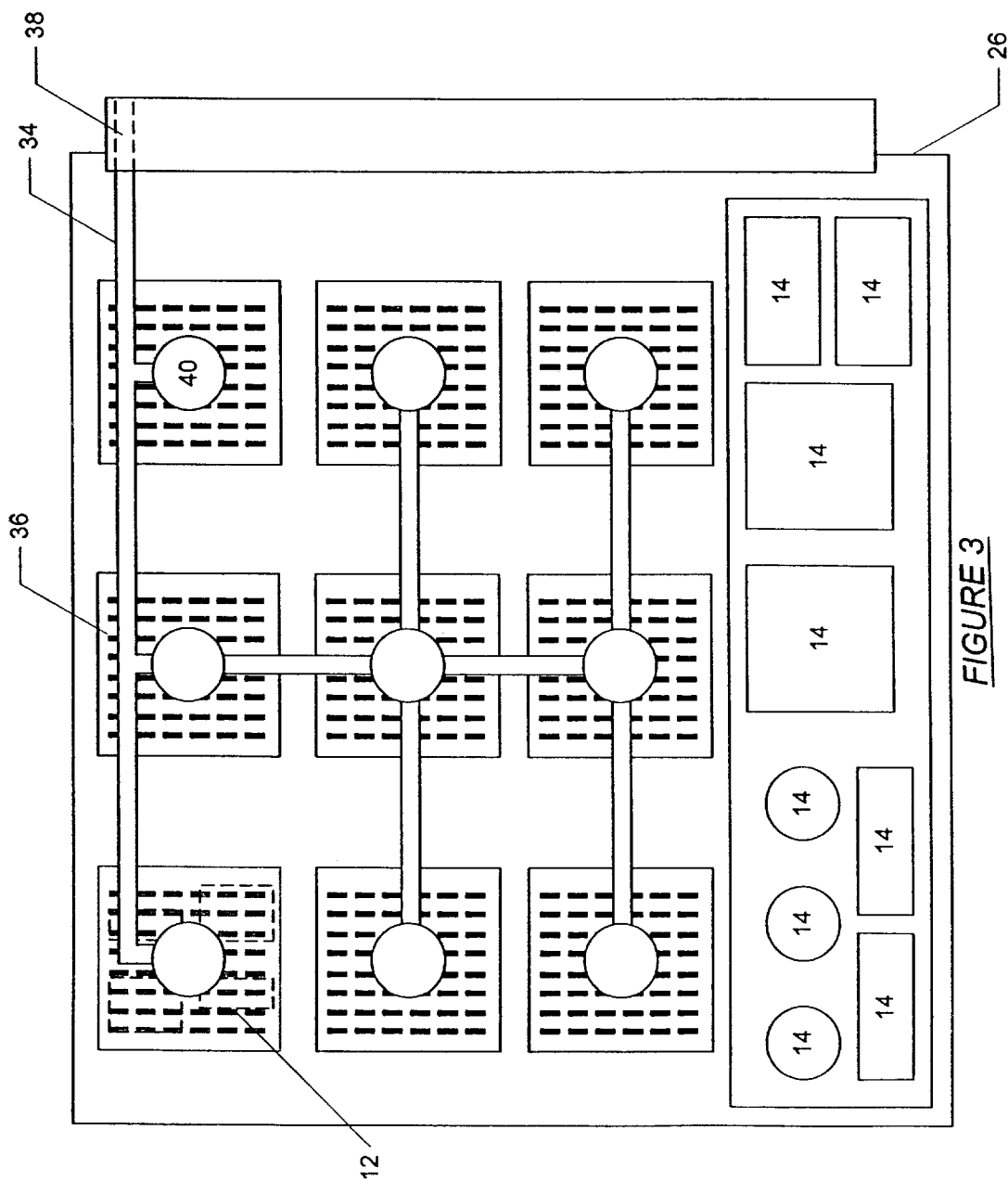
FIG. 3 illustrates a circuit board in accordance with one embodiment of the invention.

FIG. 3 illustrates a circuit board in accordance with one embodiment of the invention. The circuit board (26) contains both high dissipation components (12) and low dissipation components (14). In this particular embodiment, the circuit board (26), contains pin fins (36) mounted on top of the high dissipation components (12). A cooling duct array (34) is used to provide cooling fluid to dissipate heat via convention from the pin fins (36). The cooling duct array (34) includes a connector (38) that connects to the backplane (28 in FIG. 2) via the port (32 in FIG. 2). The cooling fluid initially enters the cooling duct array (34) from this point. The cooling duct array (34) is a network of ducting that includes nozzles (40). Each nozzle (40) is located proximate to each of the pin fins (36) mounted on top of each of the high dissipation components (12). In this embodiment of the invention there is one nozzle (40) located above each high dissipation component, i.e., there is one nozzle for each high dissipation component (12) on the circuit board. Once the cooling fluid enters the cooling duct array (34) it flows through the cooling duct array and exits at each of the nozzles (40).

In one embodiment of the invention, the cooling duct array (34) is arranged such that the flow rate of the cooling fluid exiting at each nozzle is substantially equal.

In another embodiment of the invention, the cooling duct array (34) is arranged such that the flow rate of the cooling fluid exiting at each nozzle (40) is proportional to amount of heat dissipated by the components located proximate to each nozzle (40).

Figure 4:
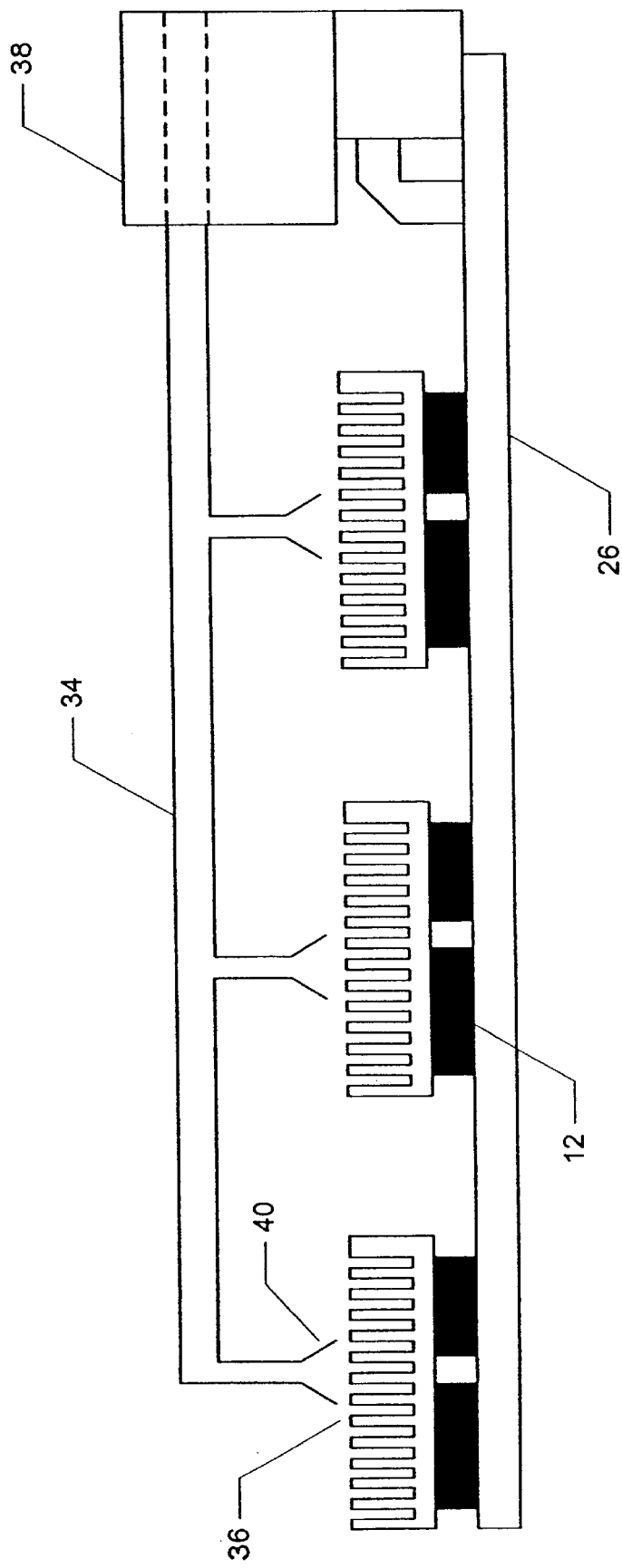
FIG. 4 is a side view of the circuit board illustrated in FIG. 3 in accordance with one embodiment of the invention.

FIG. 4 is a side view of the circuit board illustrated in FIG. 3. The circuit board (26) includes a number of high dissipation components (12), each having pin fins (36). The nozzles (40) are located on top of the pin fins (36) such that the cooling fluid initially makes contact with the top of the pin fins (36).

Figure 5:
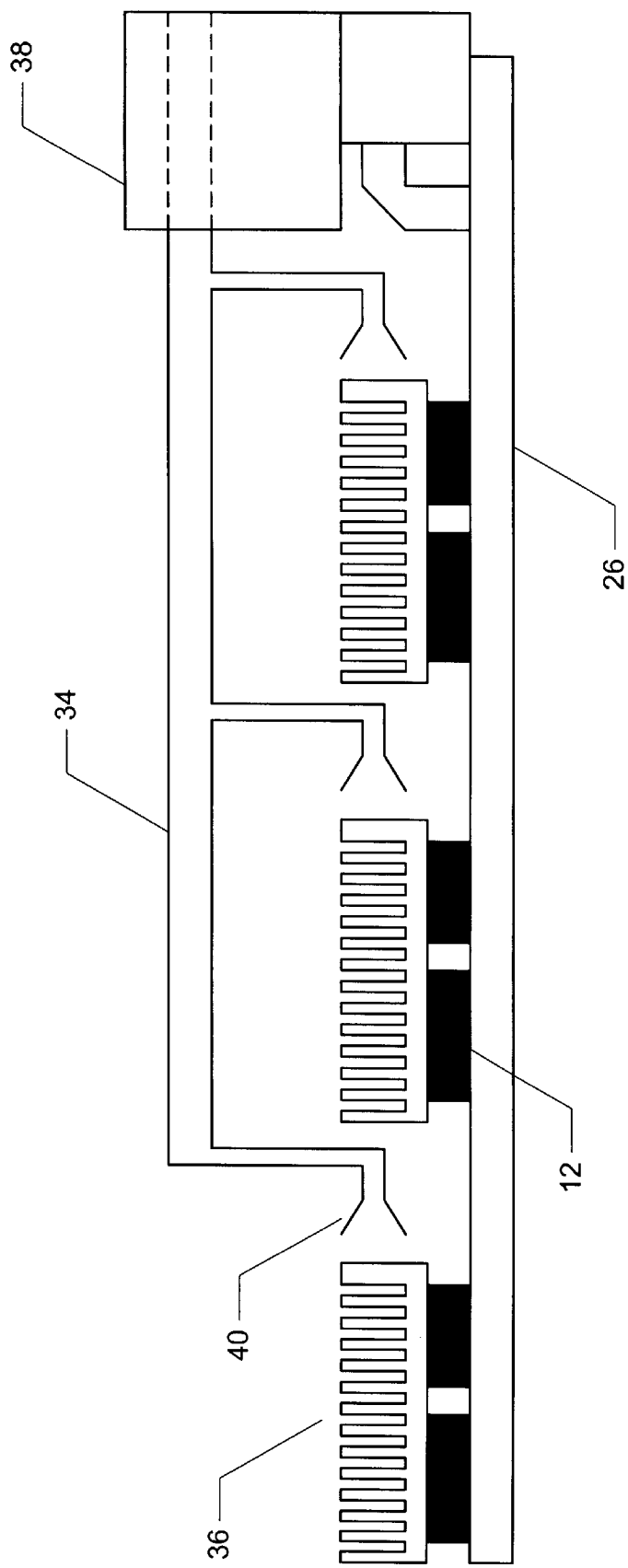
FIG. 5 is a side view of a in accordance with one embodiment of the invention.

In another embodiment of the invention the cooling duct array and nozzles may be positioned such that the cooling fluid flows across the pin fins in the plane of the circuit board upon which they are mounted. FIG. 5 is another side view of a in accordance with this embodiment. The circuit board (26) includes a number of high dissipation components (12), each having pin fins (36). The nozzles (40) are located on the side of the pin fins (36) such that the cooling fluid initially makes contact with one side of the pin fins (36) and flows across the to the other side of the pin fins (36).

In one embodiment of the invention the nozzles (40) are constructed using shape memory alloy (SMA). The nozzles (40) are constructed such that when high dissipation components (12), in close proximity to the nozzles (40), are dissipating high amounts of heat the nozzle opening will increase in area to increase the amount of cooling fluid exiting the nozzle (40). In contrast, when high dissipation components (12), in close proximity to the nozzles (40), are dissipating low amounts of heat the nozzle opening will decrease in area to decrease the amount of cooling fluid exiting the nozzle (40).

The amount of cooling fluid required to cool a particular high dissipation component (12), i.e., the cooling fluid flow rate, may be obtained, for example, by flow models. Depending on the number and placement of the high dissipation components (12) within a given computer the cooling duct array (34) may include ducting of a small or large diameter. In the case where there is a space constraint a small diameter duct array may be used. Conversely, in the case where there is no significant space constraint a large diameter duct array may be used. Since the cooling fluid flow rate required to cool the high dissipation components is related only to the component heat dissipation the pressure of the cooling fluid must be adjusted to in accordance with the diameter of the ducting to maintain a suitable cooling fluid flow rate.

For example, if small diameter ducting is used then the pressure must be increased to provide the high dissipation components with an adequate amount of cooling fluid. Conversely, if large diameter ducting is used then the pressure requirements may be lower. Thus, depending on the pressure requirements of a given cooling system, the cooling fluid source may vary substantially.

For example, if the pressure requirements are relatively low, then the cooling fluid source may only require a fan to move the cooling fluid from the cooling fluid source to the nozzles. In contrast, if the pressure requirements are relatively high, then the cooling fluid source may require a high pressure compressor to move the cooling fluid at the required flow rate.

Those skilled in the art will appreciate that while pin fins have been to describe the invention, any type of heat dissipation device for conducting heat away from the microprocessor may be used, e.g., heat pipes, circular fins, rectangular fins, etc.

The invention may have one or more of the following advantages. The invention provides efficient heat dissipation for high dissipation components in a computer or electronic system. Further, the invention provides a scalable cooling system for use in computer systems that have multiple processors. Further, the invention includes functionality to allow for "hot swapping" of circuit boards. Further, the invention provides a means to maintain an overpressure within the cabinet to reduce dust and foreign airborne particle from entering the cabinet. Further, the in some embodiments of the invention the cooling effect achieved by using a compressed cooling fluid may be augmented by expansion cooling. Further, the invention provides a continuous flow of compressed cooling fluid that aids in cleaning heat dissipation components e.g., pin fins. Further, in some embodiments a noise reduction is achieved by placing the compressor away for the cabinet.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer cooling system, comprising:
   a cooling fluid source; and
   a cooling duct array distributing cooling fluid from the cooling fluid source over a plurality of heat dissipating components on a circuit board; and
   a backplane having a bus with at least one port, wherein the cooling duct array is connected to the at least one port with a connector;
   wherein the cooling duct array is attached to the circuit board.

2. The computer cooling system of claim 1, wherein the cooling duct array comprises a plurality of nozzles each proximate to at least one of the plurality of high dissipation components.

3. The computer cooling system of claim 1, wherein the plurality of heat dissipating components are each operatively connected to a heat sink.

4. The computer cooling system of claim 3, wherein the heat sink comprises pin fins.

5. The computer cooling system of claim 1, wherein the port is closed when not connected to the cooling duct array.

6. The computer cooling system of claim 1, wherein cooling fluid comprises a compressed gas.

7. The computer cooling system of claim 1, wherein cooling fluid comprises compressed air.

8. The computer cooling system of claim 1, wherein the cooling fluid source comprises a compressor.

9. The computer cooling system of claim 1, wherein the cooling fluid source comprises a compressor and a dehumidifier.

10. The computer cooling system of claim 1, wherein the cooling fluid source comprises a container storing compressed cooling fluid.

11. The computer cooling system of claim 1, wherein the cooling fluid source comprises a fan.

12. The computer cooling system of claim 2, wherein the cooling duct array is arranged such that a flow rate of the cooling fluid exiting at each nozzle is substantially equal.

13. The computer cooling system of claim 2, wherein the cooling duct array is arranged such that a flow rate of the cooling fluid exiting at each nozzle is related to an amount of heat dissipated by a one of the high dissipation components located proximate to each nozzle.

14. The computer cooling system of claim 2, wherein each nozzle is on the side of each high dissipation component, wherein the cooling fluid exiting the nozzle flows in the plane of the circuit board upon which the high dissipation components are mounted.

* * * * *